United States Patent
Haukka et al.

(10) Patent No.: US 12,492,472 B2
(45) Date of Patent: Dec. 9, 2025

(54) METHODS FOR DEPOSITING MATERIAL WITHIN A GAP USING AN INHIBITOR

(71) Applicant: ASM IP Holding B.V., Almere (NL)

(72) Inventors: Suvi P. Haukka, Helsinki (FI); Eva E. Tois, Espoo (FI); Varun Sharma, Helsinki (FI)

(73) Assignee: ASM IP Holding B.V., Almere (NL)

( * ) Notice: Subject to any disclaimer, the term of this patent is extended or adjusted under 35 U.S.C. 154(b) by 576 days.

(21) Appl. No.: 17/897,311

(22) Filed: Aug. 29, 2022

(65) Prior Publication Data

US 2023/0069459 A1 Mar. 2, 2023

Related U.S. Application Data

(60) Provisional application No. 63/238,833, filed on Aug. 31, 2021.

(51) Int. Cl.
*C23C 16/455* (2006.01)
*C23C 16/52* (2006.01)
*H01L 21/02* (2006.01)

(52) U.S. Cl.
CPC .. *C23C 16/45527* (2013.01); *C23C 16/45544* (2013.01); *C23C 16/45553* (2013.01); *C23C 16/52* (2013.01); *H01L 21/02178* (2013.01); *H01L 21/02186* (2013.01); *H01L 21/02189* (2013.01); *H01L 21/0228* (2013.01); *H01L 21/02312* (2013.01)

(58) Field of Classification Search
CPC ........ C23C 16/45527; C23C 16/45544; C23C 16/45553; C23C 16/52
See application file for complete search history.

(56) References Cited

U.S. PATENT DOCUMENTS

| | | | | |
|---|---|---|---|---|
| 9,932,670 | B2* | 4/2018 | Su | C23C 16/4405 |
| 2009/0081374 | A1* | 3/2009 | Yang | C23C 16/545 |
| | | | | 427/96.8 |
| 2012/0276306 | A1* | 11/2012 | Ueda | C23C 16/40 |
| | | | | 427/576 |
| 2015/0243545 | A1* | 8/2015 | Tang | H01L 21/76837 |
| | | | | 118/704 |
| 2020/0017967 | A1* | 1/2020 | Abel | H01L 21/0228 |

OTHER PUBLICATIONS

Gan, Xin, "Optimization of Selective Inhibition for Void-Suppressed Tungsten Gap-Fill". 2021 China Semiconductor Technology International Conference (CSTIC), Shanghai, China, 2021, pp. 1-2.*

* cited by examiner

*Primary Examiner* — Bret P Chen
(74) *Attorney, Agent, or Firm* — Laine IP Oy; Mark W. Scott

(57) ABSTRACT

A method for depositing a material within a gap of a substrate in a cyclic deposition process. The method includes, within a reaction chamber, subjecting the gap to at least one deposition cycle, the at least one deposition cycle including: (a) contacting the gap with an inhibitor, wherein the gap includes a plurality of chemisorption sites on a surface thereof, and wherein the inhibitor occupies a portion of the chemisorption sites in the gap; (b) following the contacting the gap with the inhibitor, contacting the gap with a first precursor to chemisorb the first precursor within the gap at chemisorption sites not occupied by the inhibitor; and (c) following the contacting the gap with the first precursor, contacting the gap with a second precursor to form the material within the gap.

18 Claims, 6 Drawing Sheets

| OH HO | OZrL$_x$   L$_x$ZrO | Oinh    inhO |
|---|---|---|
| OH HO | OZrLx   LxZrO | Oinh    inhO |
| OH HO | OZrL$_x$   L$_x$ZrO | Oinh    inhO |
| OH HO | OZrL$_x$   L$_x$ZrO | Oinh    inhO |
| OH HO | OZrL$_x$   HO | Oinh    inhO |
| OH HO | OZrL$_x$   L$_x$ZrO | OZrL$_x$   L$_x$ZrO |
| OH HO | OH   HO | OZrL$_x$   L$_x$ZrO |
| OH HO | OZrL$_x$   HO | OZrL$_x$   L$_x$ZrO |
| OH HO | OH   L$_x$ZrO | OZrL$_x$   L$_x$ZrO |
| OH HO | OH   HO | OH   L$_x$ZrO |
| OH HO | OH   HO | OZrL$_x$   L$_x$ZrO |
| OH HO | OH   HO | OH   L$_x$ZrO |
| OH HO | OH   HO | OZrL$_x$   L$_x$ZrO |

PRIOR ART

| | |
|---|---|
| Oinh | inhO |
| OZrL$_x$ | inhO |
| Oinh | L$_x$ZrO |
| Oinh | inhO |
| OZrL$_x$ | L$_x$ZrO |
| Oinh | inhO |
| OZrL$_x$ | HO |
| Oinh | L$_x$ZrO |
| OH | L$_x$ZrO |
| Oinh | L$_x$ZrO |
| OZrL$_x$ | L$_x$ZrO |
| L$_x$ZrO | L$_x$ZrO |
| OH | HO |

FIG. 4

| Oinh  inhO | O⁻      ⁻O   | OZrL$_x$  L$_x$ZrO |
|---|---|---|
| Oinh  inhO | O⁻      ⁻O   | OZrL$_x$  L$_x$ZrO |
| Oinh  inhO | O⁻      ⁻O   | OZrL$_x$  L$_x$ZrO |
| Oinh  inhO | O⁻      ⁻O   | OZrL$_x$  L$_x$ZrO |
| Oinh  inhO | O⁻      ⁻O   | OZrL$_x$  L$_x$ZrO |
| OZrL$_x$  L$_x$ZrO | OZrL$_x$  L$_x$ZrO | OZrL$_x$  L$_x$ZrO |
| OZrL$_x$  L$_x$ZrO | OZrL$_x$  L$_x$ZrO | OZrL$_x$  L$_x$ZrO |
| OZrL$_x$  L$_x$ZrO | OZrL$_x$  L$_x$ZrO | OZrL$_x$  L$_x$ZrO |
| OZrL$_x$  L$_x$ZrO | OZrL$_x$  L$_x$ZrO | OZrL$_x$  L$_x$ZrO |
| OH    L$_x$ZrO | OH    L$_x$ZrO | OH    L$_x$ZrO |
| OZrL$_x$  L$_x$ZrO | OZrL$_x$  L$_x$ZrO | OZrL$_x$  L$_x$ZrO |
| OH    L$_x$ZrO | OH    L$_x$ZrO | OZrL$_x$  L$_x$ZrO |
| OZrL$_x$  L$_x$ZrO | OZrL$_x$  L$_x$ZrO | OZrL$_x$  ZrL$_x$O |

METHODS FOR DEPOSITING MATERIAL WITHIN A GAP USING AN INHIBITOR

CROSS-REFERENCE TO RELATED APPLICATIONS

This patent application claims the benefit of U.S. Provisional Application No. 63/238,833, filed Aug. 31, 2021, the entirety of which is incorporated by reference herein.

FIELD

The present disclosure generally relates to methods and systems suitable for manufacturing electronic devices. More particularly, the disclosure relates to methods for the deposition of a material within a gap of a substrate in a cyclic deposition process utilizing an inhibitor which occupies a portion of available chemisorption sites within the gap, thereby reducing chemisorption of a subsequently introduced first precursor in the gap. In this way, the inhibitor promotes deeper penetration of the first precursor and a subsequently deposited material in the gap and/or more a conformal deposition of a desired material in the gap.

BACKGROUND

Films or layers of material are deposited on a surface of a substrate during manufacturing of electronic devices, such as integrated circuits. During the manufacturing process, gaps, such as recesses, trenches, or spaces between elevated portions, such as fins, may be formed. Often, the gaps need to be filled with specific materials, e.g., metal oxides, to achieve desired device functionalities. Currently, new device architectures place increasingly stringent requirements on thermal budgets, as well as aspect ratios, spacing, and shapes of gaps. For example, in memory applications (e.g., V-NAND and DRAM), surface area requirements are increasing due to a need for increased memory capacity. In particular, V-NAND structures may have a surface area which is 200× that of a planar devices, for example. Thus, the demand for 3D structures having high aspect ratio gaps, e.g., 100:1 or more, that require conformal deposition therein is significantly increasing.

Unfortunately, to date, it has been challenging to obtain conformal deposition of materials within gaps, including those with a high aspect ratio, e.g., 100:1 or more. In some instances, when a precursor is introduced to a substrate having a high aspect ratio gap, a large amount of the precursor may already be chemisorbed at an upper portion of the gap (toward the gap opening) or may escape from the reactor without taking part in deposition reactions. As such, lower amounts of the precursor will travel towards a base portion of the high aspect ratio gap. This may result is insufficient and/or non-conformal deposition of the material, particularly in deeper locations in the gap (away from the opening of the gap). Accordingly, improved methods and apparatuses for gap filling in substrates are desired.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Aspects of the present invention may overcome the deficiencies in the art by disclosing methods and systems which provide for the deposition of a material within a gap of a substrate in a cyclic deposition process. In certain embodiments, the process can be utilized to provide conformal deposition within high aspect ratio gaps, e.g., 10:1-1000:1, of a substrate. To accomplish the above, the methods utilize an inhibitor which occupies a portion of available chemisorption sites in the gap, thereby reducing chemisorption of a subsequently introduced first precursor within the gap. In this way, the inhibitor promotes greater conformal deposition and/or deeper penetration of a deposited material in the gap compared to conventional methods as will be discussed in further detail below.

In certain embodiments, the inhibitor occupies at least a portion of available chemisorption sites within the gap such that when a first precursor is introduced to the substrate, chemisorption of the first precursor is reduced for at least a depth extending into the gap from an opening of the gap to a base portion of the gap upon contact of the gap with the first precursor. Put another way, in certain embodiments, the inhibitor prevents the first precursor from binding to the chemisorption sites occupied by the inhibitor, and thus promotes travel of the first precursor deeper into a depth of each gap. In this way also, the first precursor may be preferentially chemisorbed deeper within the gap than without the use of an inhibitor as described herein. In other embodiments, the inhibitor instead or additionally promotes a more uniform distribution of at least the first precursor within the gap, thereby resulting in a more conformal deposit of a desired material. In certain embodiments, after introduction of at least the first precursor, the inhibitor may be removed from the gap to enable the first precursor to be chemisorbed at the sites previously occupied by the inhibitor compound.

In one aspect, there is disclosed a method of depositing a material within a gap of a substrate in a cyclic deposition process, the method comprising, within a reaction chamber, subjecting the gap to at least one deposition cycle, the at least one deposition cycle comprising:

(a) contacting the gap with an inhibitor, wherein the gap comprises a plurality of chemisorption sites on a surface thereof, and wherein the inhibitor occupies a portion of the chemisorption sites in the gap;

(b) following the contacting the gap with the inhibitor, contacting the gap with a first precursor to chemisorb the first precursor within the gap at chemisorption sites not occupied by the inhibitor; and (c) following the contacting the gap with the first precursor, contacting the gap with a second precursor to form the material within the gap.

In accordance with yet another aspect, there is disclosed a system for depositing a material within a gap of a substrate comprising:

a reaction chamber for accommodating the substrate, the substrate comprising a plurality of chemisorption sites on a surface thereof and the gap;

a first source for an inhibitor in gas communication via a first valve with the reaction chamber;

a second source for a first precursor in gas communication via a second valve with the reaction chamber;

a third source for a second precursor in gas communication via a third valve with the reaction chamber; and a controller operably connected to the first, second, and third valves configured and programmed to control in at least one deposition cycle in the reaction chamber, the at least one deposition cycle comprising:

contacting the gap with an inhibitor, wherein the gap comprises a plurality of chemisorption sites on a surface thereof, and wherein the inhibitor occupies a portion of the chemisorption sites in the gap;

following the contacting the gap with the inhibitor, contacting the gap with a first precursor to chemisorb the first precursor within the gap at chemisorption sites not occupied by the inhibitor; and following the contacting the gap with the first precursor, contacting the gap with a second precursor to form the material within the gap.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings:

FIG. 3A-3C illustrate the chemisorption of an inhibitor and a first precursor within a gap in accordance with an aspect of the present invention.

FIG. 4 illustrates the chemisorption of an inhibitor and a first precursor within a gap in accordance with an aspects of the present invention.

FIGS. 5A-5D illustrate the removal of the inhibitor and the deposition of a first precursor within a gap in accordance with an aspects of the present invention.

Elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and apparatuses provided below is merely exemplary and is intended for purposes of illustration only. The following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims.

It will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. Unless otherwise noted, the exemplary embodiments or components thereof may be combined or may be applied separate from each other.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like.

Figure 1:
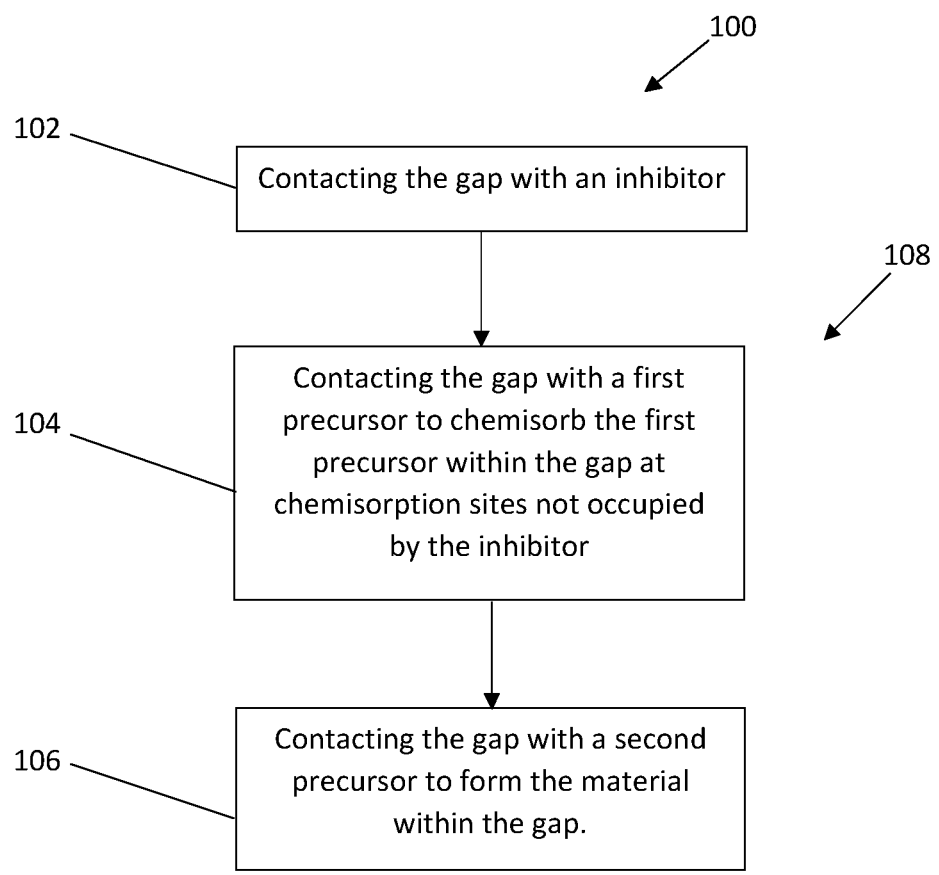
FIG. 1 illustrates a method of depositing a material within a gap of a substrate in accordance with an aspect of the present invention.

Now referring to FIG. 1, in accordance with one aspect of the present invention, there is disclosed a method 100 for depositing a material within one or more gaps (hereinafter "gaps" of a substrate in a cyclic deposition process). The process comprises step 102 of contacting the gap with an inhibitor, wherein the gap comprises a plurality of chemisorption sites on a surface thereof, and wherein the inhibitor occupies a portion of the chemisorption sites in the gap. In addition, the first deposition cycle comprises step 104 of following the contacting the gap with the inhibitor, contacting the gap with a first precursor to chemisorb the first precursor within the gap at chemisorption sites not occupied by the inhibitor. Further, the first deposition cycle comprises step 106 of following the contacting the gap with the first precursor, contacting the gap with a second precursor to form the material within the gap.

Steps 104, 106, 108, when performed at least once, constitute at least one deposition cycle 108, e.g., a first deposition cycle, within the process 100. It is understood, however, that by "first," it is not necessarily meant that the first deposition cycle is the first deposition cycle in the process 1000. The first deposition cycle may be performed any suitable number of times, such as 2, 5, 10, 25, 50, 100, 500 or more times, in the cyclic deposition process, such as an ALD process to achieve the desired results and provide conformal deposition of material within gaps of a desired substrate. It is further contemplated that although gaps are primarily referred to herein, the deposition techniques described herein may deposit a desired material on other or remaining portions of the substrate other than the gaps.

In addition, in certain embodiments, the process 100 will include at least an additional deposition cycle which is performed prior to or after the first deposition cycle. Likewise, by "additional deposition cycle," no order is specified or intended and the additional deposition cycle may, in fact, be the first in the process 100. The additional deposition cycle includes at least steps 104 and 106, but does not include contacting the substrate with an inhibitor. In this way, the process 100 may include a mixture of deposition cycles, including those which utilize an inhibitor as in step 102 and those which do not to achieve the desired deposition of material.

The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be single wafer ALD reactor. In some embodiments, the reaction chamber may be a high-volume manufacturing single wafer ALD reactor. In some embodiments, the reaction chamber may be a batch reactor for manufacturing multiple substrates simultaneously.

The semiconductor processing apparatus may comprise any suitable apparatus known in the art for depositing a material on a substrate, including commercially available units. In an embodiment, the semiconductor processing apparatus comprises a reactor comprising at least one reaction chamber for accommodating a substrate therein. The reactor may have, for example, two, three, six or eight reaction chambers and may comprise any suitable fluid paths, valves, etc. necessary for the input of desired materials to the reactor.

As used herein, the term "substrate" may refer to any underlying material or materials that may be used to form, or upon which, a device, a circuit, or a material layer may be formed. The substrate may also be referred to as a three-dimensional substrate herein since the substrate is a non-planar. The substrate can include a bulk material, such as silicon (e.g., single-crystal silicon) and may include one or more layers overlying the bulk material. The substrate may include nitrides, for example, TiN; oxides; insulating materials; dielectric materials; conductive materials; metals, such as such as tungsten, ruthenium, molybdenum, cobalt or copper; or crystalline, epitaxial, heteroepitaxial, and/or single crystal materials. In certain embodiments, the substrate comprises silicon. The substrate may comprise other materials, as described above, in addition to silicon. In certain embodiments, the other materials may form layers.

In accordance with an aspect, the substrate is one having a plurality of chemisorption sites on an outer surface thereof such that the substrate, when contacted with a subsequent species, e.g., an inhibitor or (first) precursor as described below, chemisorbs the desired species, e.g., inhibitor and/or first precursor, thereon. The material of the substrate itself may provide the chemisorption sites or the substrate may be coated with one or more layers which provide the desired chemisorption sites. In an embodiment, the chemisorption sites comprise terminal hydroxyl groups. Exemplary materials which provide a substrate having chemisorption sites as described herein include, but are not limited to, various oxides, such as $SiO_2$, aluminum oxides, $InGaZnO_x$, $HfZrO_x$ and nitrides, such as TiN, TaN, SiN.

As used herein, the term "gap" refers to any change in a surface topology of the substrate which leads to at least one area of the substrate surface being lower than other areas of the substrate. Gaps thus include topologies in which parts of the substrate surface are lower relative to the majority of the substrate surface. These include trenches, vias, recesses, valleys, crevices, holes, such as channel holes, and the like. Further, also areas between elevated features protruding upwards of the majority of the substrate surface form gaps. Thus, the space between adjacent fins is considered a gap.

In certain embodiments, gaps may extend vertically from the substrate surface. In certain embodiments, gaps may further comprise horizontal portions (sometimes termed lateral cavities), i.e., portions of a gap that extend horizontally from a vertical portion of a gap. However, in some embodiments, a gap may extend substantially only horizontally. Such gaps may be located at the sides of elevated portions of a substrate. By "horizontal direction" as used herein, it is meant a direction substantially parallel with the overall substrate surface. Conversely, a gap extending vertically is substantially perpendicular relative to the overall substrate surface. In some embodiments, a gap is generated by exposing a substrate to a plasma that etches portions of the substrate and/or layers deposited thereon.

In certain embodiments, a pre-treatment with, for example, plasma, oxidizing gas, or the like may be used to amend the chemisorption properties of a gap surface.

Figure 2:
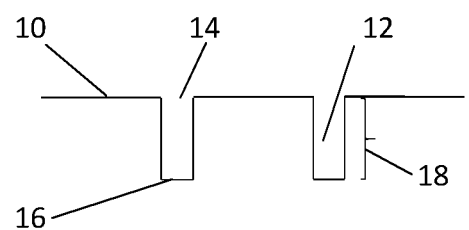
FIG. 2 illustrates a substrate having a gap to be filled with a material according to an aspect of the present invention.

As discussed above, the substrate includes one or more gaps formed therein. Referring now to FIG. 2, there is shown an exemplary substrate 10 having a plurality of gaps 12 formed therein, wherein each gap 12 includes a gap opening 14, a bottommost portion 16, and a depth 18 extending from the gap opening 14 to the bottommost portion 16. In certain embodiments, by use of the inhibitor as described herein, the deposition of materials can be promoted deeper into the gap 12 or a greater depth from the opening 14, thereby resulting in greater deposition further into the gap 12 and/or a more conformal deposit in the gap 12.

In addition, the gap 12 may have tapered or slanting walls, narrowing the diameter of the gap either towards the gap opening 14 or towards the bottommost portion 16 of the gap 12. The tapering or slanting may cause the gap opening 14 to have a larger surface area than the bottommost portion 16. Alternatively, the tapering may cause the gap opening 14 to have a smaller surface area than the bottommost portion 16. Gaps having a smaller surface area at the gap opening 14 relative to the bottommost portion 16 of the gap 12 may be challenging to fill without void formation. In certain embodiments, the gap 12 has a relatively symmetrical diameter from the gap opening 14 to the bottommost portion of the gap 12.

In certain embodiments, the width of the gap 12 may be from about 3 nm to about 400 nm. For example, the width of the gap 12 may be from about 4 nm to about 300 nm, from about 5 nm to about 100 nm, from about 10 nm to about 50 nm, or about 20 nm. In some embodiments, the width of the gap 12 may be from about 100 nm to about 400 nm, such as about 150 nm, 200 nm, 250 nm, 300 nm or 350 nm. In other embodiments, the width of the gap 12 may be from about 3 nm to about 50 nm, such as from about 3 nm to 10 nm, from about 3 nm to 20 nm, from about 3 nm to about 30 nm, from about 3 nm to about 40 nm. As an example, the width of the gap 12 may be about 4 nm, about 5 nm, about 6 nm, about 8 nm or about 12 nm, about 15 nm, about 18 nm, about 25 nm or about 35 nm.

In certain embodiments, the depth of the gap 12 is from about 50 nm to about 7 μm, or about 25 μm. Examples of applications in which the depth of the gap 12 may be in the micrometer range, may include DRAM or VNAND applications, including applications wherein a hole is etched through a stack. In certain embodiments, the depth of the gap 12 may be from about 50 nm to about 4 μm, from about 50 nm to about 2 μm, from about 50 nm to about 1 μm or from about 50 nm to about 500 nm. In additional examples, the depth of gap 12 may be from about 50 nm to about 200 nm, from about 50 nm to about 200 nm, or from about 200 nm to about 7 μm, from about 200 nm to about 5 μm, from about 200 nm to about 3 μm, from about 200 nm to about 1 μm, or from about 200 nm to about 500 nm.

In some embodiments, the depth to width aspect ratio (aspect ratio) of the gap 12 is between approximately 10:1 to 1000:1 such as such as 50:1 to 500:1, 100:1 to 500:1, or 100:1 to 1000:1. Aspects of the present invention allow for the filling of gaps 12 having high aspect ratios with metal material in a manner not previously achieved in the art. As used herein, the terms "about" or "approximately" refer to a value which is ±1% of the stated value. In certain embodiments, the substrate 10 may be provided with any other desirable structural features.

The inhibitor is used within a cyclic deposition process such that a desired material is deposited on the substrate 10, including within the gap 12. As noted above, the process 100 includes step 102 of contacting the gap 12 with an inhibitor that occupies a portion of the chemisorption sites in the gap 12. Thereafter, the process 100 further includes step 104 of following the contacting the substrate 10 with the inhibitor, contacting the substrate 10 with the first precursor to chemisorb the first precursor to the substrate 10 within the gap 12 at chemisorption sites not occupied by the inhibitor.

Thereafter, the process 100 comprises step 108 of following the contacting the substrate 10 with the first precursor, contacting the substrate 10 with a second precursor to form the desired material within the gap 12.

In an embodiment, step 102 of contacting the substrate 10 with an inhibitor (which occupies at least a portion of the chemisorption sites) reduces chemisorption of a first precursor for at least a distance extending into the gap 12 from the gap opening 14 to the bottommost portion 16 of the gap upon contact of the substrate 10 with the first precursor. For example, FIG. 3A shows an embodiment of a gap 12 having a plurality of chemisorption sites (e.g., —OH groups) on a surface thereof. FIG. 3B illustrates a typical prior art scenario where a precursor ($ZrL_x$) is pulsed to the substrate to attempt to deposit material within the gaps 12. However, as shown in FIG. 3B, the inhibitor (Inh) does not fully saturate the chemisorption sites (e.g., —OH groups as shown) in the gap 12 and is chemisorbed primarily in an upper portion of the gap 12, e.g., in an upper half of the gap 12, and the precursor will typically be depleted before any precursor reaches a lower portion, e.g., lower half, of the gap 12. Ultimately, the result is an insufficient amount of deposited material within the gap.

In some embodiments, the chemisorption sites on the surface of a substrate comprise Si—O—Si bridges. In some embodiments, the chemisorption sites on the surface of a substrate comprise nitrogen. In some embodiments, the chemisorption sites comprise amine groups. In some embodiments, the chemisorption sites comprise $NH_2$. In some embodiments, the chemisorption sites comprise —NH. In some embodiments, the chemisorption sites comprise N.

In an aspect, the process 100 described herein addresses this deficiency in the art and instead promotes deeper penetration of the first precursor and a subsequently deposited material in the gap and/or more a conformal deposition of a desired material in the gap. As shown in FIG. 3C, in the process 100, the gap 12 is contacted with an inhibitor (Inh) which occupies a portion of the chemisorption sites (e.g., —OH sites), particularly in an upper portion of the gap 12. Thereafter, when the first precursor (e.g., $ZrL_x$) is contacted with the gap 12, the first precursor will travel deeper into the depth 18 of the gap 12 since a portion of the chemisorption sites are already occupied by the inhibitor (Inh), particularly in an upper region of the gap 12.

It is understood that the present invention is not so limited, however, and that the distribution of the inhibitor in the gap may not be so precisely located in the upper region of the gap 12 or at the first available chemisorption sites. In other embodiments, as shown in FIG. 4, the inhibitor (Inh) may be more randomly or uniformly distributed throughout the depth 18 of the gap 12. In this way, a subsequently introduced first precursor will also be chemisorbed throughout the depth of the gap 12 relative to prior art processes (see FIG. 3B). Thereafter, when a second precursor is introduced to the reaction chamber which is chemisorbed by the first precursor, the desired deposit of a material may be formed in the gap 12.

In certain embodiments, the inhibitor may be contacted with the gap 12 such that the inhibitor primarily occupies chemisorption sites in an upper region, e.g., upper half, of the gap 12. In this way, the subsequently introduced further precursor will travel further into a depth of the gap 12 from the opening to the bottommost portion 18 in order to find available chemisorption sites. In other embodiments, the inhibitor may be more evenly distributed throughout a depth of the gap 12, but the first precursor will still be expected to travel further into the depth 18 of the gap 12 due to the presence of fewer chemisorption sites near the upper region of the gap 12. In either instance, it is understood that the inhibitor will be contacted with the substrate 10 in an amount which will not saturate the available chemisorption sites within the gap 12.

To achieve this end, the inhibitor may be provided in any suitable amount to provide the desired reduction of chemisorption of the first precursor without saturating the available chemisorption sites within the gap 12. Theoretically, the number of available chemisorption sites may be calculated to estimate the amount of inhibitor needed to perform the method according to the current disclosure. However, the dynamics of the inhibitor chemisorption depend on many factors, such as inhibitor residence time in the reaction chamber (which may be affected by pulsing time, gas flow speed, etc.), temperature, pressure, reactor type, and the like. Although any inhibitor and/or surface material reactivity evaluation has to be done based on the surface area, such an ideal condition-based calculation typically serves as a starting point for adjusting process parameters for a given reactor configuration.

The inhibitor may be any suitable compound which may at least be chemisorbed by the substrate within the gap 12 as described herein, and in certain embodiments also is removable from the substrate 10 by contact with a suitable (removal) gas. In certain embodiments, the inhibitor comprises an organometallic material. In a particular embodiment, the inhibitor comprises a cyclopentadienyl compound, such as a tris(dimethylamino)cyclopentadienyl zirconium. In other embodiments, the inhibitor may comprise a beta-diketonate compound, such as acetylacetone. In still other embodiments, the inhibitor may comprise a boron-containing compound, such as triethylborane (TEB) or trimethylborane (TMB). In still other embodiments, the inhibitor may comprise an alkylhalide compound such as chloromethane ($CH_3Cl$) or dichloromethane ($CH_2Cl_2$). Thus, in certain embodiments, the inhibitor may comprise a member selected from the group consisting of a cyclopentadienyl compound, a beta-diketonate compound, a boron-containing compound, and an alkylhalide compound. Alternatively, the inhibitor may comprise any other compound which provides the desired function(s) in the process.

In certain embodiments, the selected inhibitor may be more effective with depositing particular materials on the substrate 10. As such, in certain embodiments, the selected inhibitor is recommended for use in depositing a particular material. In particular embodiments, there are disclosed particular inhibitor/deposited material pairs for use in the processes disclosed herein. In certain embodiments, the pairs are selected such that the deposited first precursor and second precursor do not react with and/or are otherwise not chemisorbed by the inhibitor. In addition, in embodiments wherein the inhibitor is removed as is described below, the inhibitor/deposited material pairs are selected such that any first or second precursor are not also be removed in the removal step.

In some embodiments, the deposited material is a metal oxide, such as a transition metal oxide, for example zirconium oxide, aluminum oxide, titanium oxide or hafnium oxide, and the inhibitor comprises a beta-diketonate, such as acetylacetone (Hacac) or 2,2,6,6,-Tetramethyl-3,5-heptanedione (Hthd). In some embodiments, the deposited material is a metal oxide as described above, and the inhibitor comprises an alkyl borane, such as trimethyl borane or triethyl borane.

In some embodiments, the deposited material is an oxide, such as a metal oxide (for example zirconium oxide or aluminum oxide), and the inhibitor comprises a cyclopentadienyl metal compound, such as tris(dimethylamino)cyclopentadienyl zirconium. In such embodiments, an oxidizing treatment, such as $O_3$ may be used to remove the inhibitor.

In some embodiments, the deposited material is an oxide, such as a metal oxide (for example zirconium oxide or aluminum oxide), or a nitride, such as a metal nitride, and the inhibitor comprises halogenated hydrocarbons. In some embodiments, the halogenated hydrocarbon is a C1 to C5 hydrocarbon, such as a C2, C3 or a C4 hydrocarbon. Exemplary halogenated hydrocarbons are chloromethane ($CH_3Cl$, $CH_2Cl_2$), chloroethane (such as 1-chloroethane, 1,2-dichloroethane, 1,1-dichloroethane), chloropropane and chloroisopropane. In some embodiments. In some embodiments, the halogen of the halogenated hydrocarbon is fluorine, bromine or iodine. In some embodiments, the halogenated hydrocarbon comprises two different halogens.

In some embodiments, the deposited material is a metal oxide, such as zirconium oxide, and the inhibitor is a metal precursor for depositing the metal oxide. In such embodiments, two metal precursors with different growth rates are used. The metal precursor with the lower growth rate is pulsed before the metal precursor with the higher growth rate, to limit the deposition rate for at least a portion of the depth from the opening of the gap to the bottommost portion. In some embodiments, the deposited metal oxide is zirconium oxide, and the metal precursor with the lower growth rate is bis(methylcyclopentadienyl)methoxymethyl zirconium and the metal precursor with the higher growth rate is tris(dimethylamino)cyclopentadienyl zirconium.

In some embodiments, the deposited material is a metal nitride, such as titanium nitride, and the inhibitor comprises a haloalkane, such as chloromethane ($CH_3Cl$, $CH_2Cl_2$), chloroethane (such as 1-chloroethane, 1,2-dichloroethane, 1,1-dichloroethane), chloropropane, chloroisopropane isobutyl-1-chloride or tert-butyl-1-chloride. In some embodiments, the inhibitor comprises a haloalkene or a haloalkyne. In some embodiments, the inhibitor comprises an olefin comprising at least 5 carbon atoms. In some embodiments, the inhibitor is a substituted silane, such as trimethyl silyl chloride.

Steps 102, 104, 106 constitute at least one deposition cycle within a cyclic deposition process. Without limitation, the cyclic deposition process may be a chemical vapor deposition (CVD), plasma-enhanced CVD (PECVD), physical vapor deposition (PVD), atomic layer deposition (ALD), or a plasma-enhanced ALD (PEALD) process. As used herein, an ALD process refers to a vapor deposition process in which deposition cycles, such as a plurality of consecutive deposition cycles, are conducted. ALD is based on controlled, often self-limiting surface reactions, of precursor chemicals. Gas phase reactions are avoided by feeding the precursors alternately and sequentially into a reaction chamber. Generally, during each cycle, the first precursor is chemisorbed to a deposition surface (e.g., a substrate surface that may include a previously deposited material from a previous ALD cycle or other material), thereby forming about a monolayer or sub-monolayer of material that does not readily react with additional first precursor. Thereafter, the second precursor is subsequently be introduced into the reaction chamber for use in converting the chemisorbed precursor to the desired material on the deposition surface.

Vapor phase precursors may be separated from each other in the reaction chamber, for example, by removing excess precursors and/or precursor by-products from the reaction chamber between precursor pulses. This may be accomplished with an evacuation step and/or with an inactive gas pulse or purge. In some embodiments, the substrate 10 is contacted with a purge gas, such as an inert gas. For example, the substrate 10 may be contacted with a purge gas between precursor pulses to remove excess precursor and precursor by-products. Suitable conditions and processes for depositing a metal material in accordance with the present invention are disclosed in U.S. Pat. No. 10,900,120; US 2020/0270626; or WO2018/106955, the entirety of each of which is hereby incorporated by reference.

The deposited material on the substrate 10 may comprise any suitable material formed by at least a first precursor and a second precursor on the substrate. In some embodiments, the desired material may be formed using at least a first, second, and one or more additional precursors. In an embodiment, the deposited material comprises an oxide, carbide, or nitride material. In an embodiment, the deposited material comprises a metal, metalloid, or non-metal compound, such as a metal, metalloid, or non-metal oxide. In a particular embodiment, the deposited material comprises a metal oxide material, such as $Al_2O_3$ or $ZrO_2$. In other embodiments, the deposited material may comprise a silicon-containing material, such as silicon oxide or silicon nitride.

Accordingly, the first precursor may comprise any suitable material to provide the desired deposited material upon contact with the second precursor. The first and second precursor are typically provided in the form of a gas. In an embodiment, the first precursor comprises a halide compound, such as a metal halide, e.g., a transition metal halide compound. In certain embodiments, the first precursor may thus comprise $TiCl_4$, $WF_6$, $TaCl_5$, $TaF_5$, $ZrCl_4$, $HfCl_4$, or the like. In other embodiments, the first precursor comprises a silicon-containing precursor, such as a silane, an aminosilane, an iodosilane, a siloxane amine, a silazine amine, a silicon halide, or a combination thereof.

The second precursor may comprise any suitable material which upon contact with the first precursor material chemisorbed to the substrate provides the desired deposited material. In an embodiment, the second precursor comprises oxygen to provide an oxide material on the substrate. In certain embodiments, the oxygen is provided in the form of molecular oxygen, water, hydrogen peroxide, ozone, and combinations thereof. In other embodiments, the second precursor comprises nitrogen. In certain embodiments, the nitrogen is provided in the form of hydrazine, $N_2$, ammonia, or as a mixture of nitrogen and one or both of argon and hydrogen. In still other embodiments, the second precursor may comprise plasma or radicals comprising nitrogen, oxygen or hydrogen species.

A carrier gas may be utilized in combination with the inhibitor, first precursor, second precursor, or any other materials disclosed herein to admit the selected material(s) continually or intermittently into the reactor chamber; to distribute precursor products, reaction products, or oxidation products; and/or or to purge remaining gasses or reaction byproducts from the reaction chamber. Suitable carrier gases or purge gases may include argon, nitrogen, helium, hydrogen, forming gas, or combinations thereof.

In certain embodiments, the process 100 may further include a step of removing the inhibitor from the substrate 10. In an embodiment, the removing is done by contacting the substrate with chemisorbed inhibitor with an amount of a gas (removal gas) effective to remove the inhibitor from the substrate. The removal gas may comprise any suitable gas effective to remove a desired amount of the inhibitor from the gap 12. In certain embodiments, the removal gas comprises an oxygen-containing gas, such as ozone, $O_2$, $H_2O_2$, and combinations thereof.

To illustrate, as shown in FIGS. 5A-5C, the inhibitor may first be reversibly chemisorbed to a portion of available chemisorption sites within the gap and a first precursor may be contacted with the gap 12 as shown in FIG. 5A such that both the inhibitor and first precursor are chemisorbed within the gap 12. Thereafter, the inhibitor may be removed upon contacting the gap 12 with a suitable removal gas as shown in FIG. 5B. Once removed, the chemisorption sites previously occupied by the inhibitor become available for chemisorption of the first precursor to the substrate 10. In a next step, the first precursor (e.g., $ZrL_x$) may again be contacted with the gap 12 to deposit the first precursor within the gap 12 at locations previously occupied by the precursor. Upon subsequent introduction of a second precursor and contact with the first precursor, the desired deposited material may be provided in the gap 12.

In certain embodiments, the removal gas reacts with the inhibitor chemisorbed to the substrate to form a species which is easily swept away by the removal gas, carrier gas, or combinations thereof. For example, in an embodiment, when triethylborane and/or trimethylborane are used as an inhibitor, the TEB and/or TMB may be converted to boron oxide using ozone gas, which is then readily removed from the substrate via the ozone gas and/or a carrier gas.

By removing the inhibitor from the gap 12, the chemisorption sites previously occupied by the inhibitor become available for chemisorption of the first precursor and subsequently the second precursor to form the deposited material within the gap 12. Thus, in certain embodiments, it may be desirable to first utilize the inhibitor material to deposit the precursors deeper within the gap 12 (in a direction away from the opening 14) and then remove the inhibitor to allow for the deposition of the desired material at other remaining chemisorption sites, e.g., sites closer to the opening 14 (see FIG. 2). In certain embodiments, the deposition of material at sites previously occupied by the inhibitor may be done by a deposition cycle, e.g., an additional deposition cycle as described herein, involving deposition of the first and second precursor without an inhibitor.

The steps of the process described herein may be performed in any suitable order to accomplish the desired results. In certain embodiments, the removing step is done after at least after step 104 of contacting the substrate with the first precursor, and in certain embodiments, also after 106 of contacting the substrate with the first precursor and the second precursor. In this way, the substrate 10 is contacted again with the first precursor, or first precursor and the second precursor to deposit material at chemisorption sites previously occupied by the inhibitor.

In further embodiments, the second precursor, e.g., one comprising ozone, may be utilized as both the second precursor to form a desired material and as a removal gas for the inhibitor. Thus, in an embodiment, the step of contacting of the gap with a second precursor to form the material within the gap and the step of removing the inhibitor from the gap occur simultaneously with the same second precursor. Thus, in an embodiment, step 104 of contacting the gap with the second precursor may form a desired material where the first precursor was previously chemisorbed and may also remove inhibitor at sites where the inhibitor was previously chemisorbed. Thereafter, once the inhibitor is removed, the gap 12 may be contacted again with the first precursor and the second precursor to deposit material at chemisorption sites previously occupied by the inhibitor. Further, in certain embodiments, the gap 12 may be contacted again with the inhibitor, to occupy at least part of the chemisorption sites again. The second and further time of contacting the gap 12 with the inhibitor may be performed identically, to occupy the chemisorption sites to a similar degree as previously. Alternatively, the second and further times of contacting the gap 12 with the inhibitor may be performed differently, leading to the chemisorption sites being more extensively or less extensively occupied by the inhibitor, depending on how the inhibitor contacting step is modified. This, may allow adjusting the deposition process during the process run to retain optimal inhibition as the deposition progresses.

In certain embodiments, the steps described herein are repeated as many times as needed to deposit a desired degree of material on the substrate. In certain embodiments, steps described herein, including the optional removing step, may be repeated 2 or more times, 5 or more times, 10 or more times, 50 or more times, 100 or more times, 500 or more times.

Figure 6:
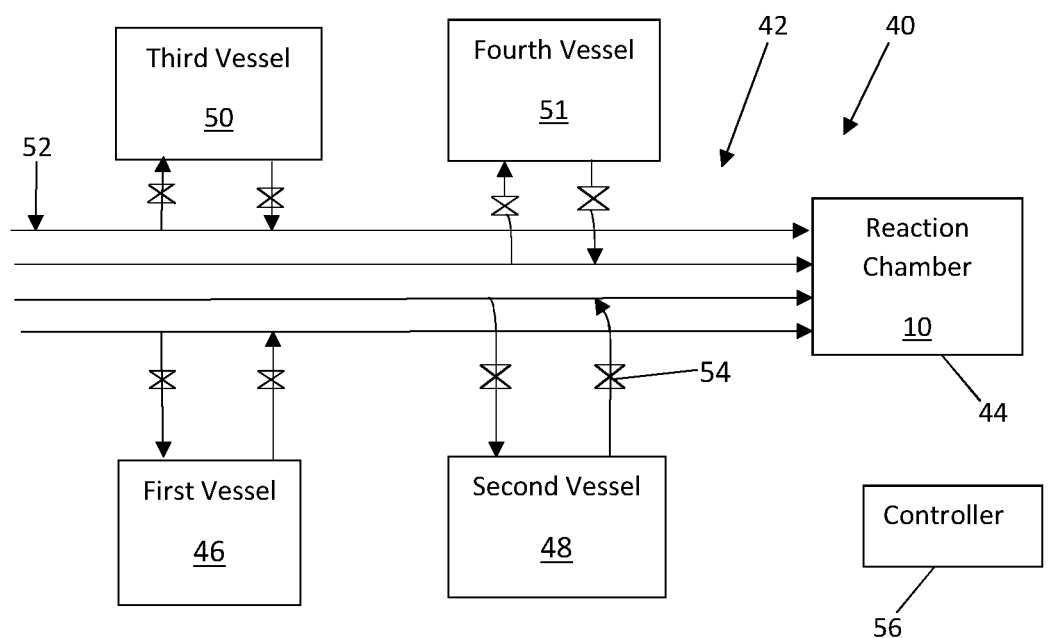
FIG. 6 illustrates a system depositing a material within a gap of a substrate in accordance with an aspect of the present invention.

In accordance with another aspect, there is provided a system for depositing a material within a gap of a substrate. Referring to FIG. 6, there is shown an embodiment of such a system 40 for carrying out the method 100 described herein. The system 40 comprises a semiconductor processing apparatus 42 comprising a reaction chamber 44 housing a substrate 10 having a plurality of gaps as described herein. As shown, there is also provided a first vessel 46 which may comprise an amount of an inhibitor as described herein. A second vessel 48 is further provided which comprises an amount of a first precursor and a third vessel 50 which comprises an amount of a second precursor as described herein. In certain embodiments, the system 50 further comprises a fourth vessel 51 which comprises an amount of a removal gas for removing the inhibitor as described herein.

A carrier gas 52 may be provided which flows from a suitable source thereof to the first vessel 46, second vessel 48, third vessel 50, and/or fourth vessel 51 to carry a desired amount of the desired materials to the reaction chamber 44. As shown, the apparatus 10 may comprise one or more valves 54, e.g., a needle, hand, pneumatic valve or other valve; pumps; piping; or the like for allowing the flow of materials through the apparatus 42. A controller 56 may also be included which is operably connected to the valves, pumps, and any other components of the apparatus for controlling the flow and delivery of components through the apparatus as would be well understood by those of ordinary skill in the art. In certain embodiments, as shown, the source vessels may be connected separately using dedicated individual lines/connections to carry a respective material to the reaction chamber 10. The processing apparatus may comprise one or more sources for carrier gas.

In an embodiment, the sources described above may be part of a standard ALD arrangement having one or more valves for controlling a purge gas such that the purge gas may be introduced into the reaction chamber 44 from a suitable source subsequent to the introduction/pulsing of the inhibitors and/or precursors into the reaction, or as is otherwise needed.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The invention claimed is:

1. A method of depositing a material within a gap of a substrate in a cyclic deposition process, the method comprising, within a reaction chamber, subjecting the gap to at least one deposition cycle, the at least one deposition cycle comprising:
   (a) contacting the gap with an inhibitor, wherein the gap comprises a plurality of chemisorption sites on a surface thereof, and wherein the inhibitor occupies a portion of the chemisorption sites in the gap;
   (b) following the contacting the gap with the inhibitor, contacting the gap with a first precursor to chemisorb the first precursor within the gap at chemisorption sites not occupied by the inhibitor; and
   (c) following the contacting the gap with the first precursor, contacting the gap with a second precursor to form the material within the gap,
   wherein the inhibitor comprises a member selected from the group consisting of a cyclopentadienyl compound, a beta-diketonate compound, a boron-containing compound, an alkylhalide compound, and combinations thereof.

2. The method according to claim 1, wherein the gap comprises an opening and a depth extending from the opening to a base portion thereof, and wherein the contacting the gap with an inhibitor reduces chemisorption of the first precursor for at least a portion of the depth from the opening to the base portion upon contact of the gap with the first precursor.

3. The method according to claim 1, further comprising removing the inhibitor from the gap.

4. The method according to claim 3, wherein the removing step is done after at least step (b), and wherein the gap is contacted with the first precursor to chemisorb the first precursor at chemisorption sites previously occupied by the inhibitor within the gap.

5. The method according to claim 4, wherein the removing step is done after steps (b) and (c), and wherein the substrate is contacted with the first precursor and the second precursor to form the material at the chemisorption sites previously occupied by the inhibitor within the gap.

6. The method according to claim 3, wherein the removing step is done with the second precursor.

7. The method according to claim 3, wherein the contacting the gap with a second precursor to form the material within the gap and removing the inhibitor from the gap occur simultaneously with the same second precursor.

8. The method according to claim 3, wherein the removing step is done by the contacting the gap with an oxygen-containing gas.

9. The method according to claim 1, wherein the first precursor comprises a member selected from the group consisting of a metal compound, a metalloid compound, a non-metal compound, and combinations thereof.

10. The method according to claim 1, wherein the first precursor comprises a metal precursor.

11. The method according to claim 1, wherein the first precursor comprises a member selected from the group consisting of a metal halide, a non-metal halide, a metalloid halide, and combinations thereof.

12. The method according to claim 1, wherein the second precursor comprises a member selected from the group consisting of an oxygen precursor, a nitrogen precursor, and a hydrogen precursor.

13. The method according to claim 1, wherein steps (a,), (b) and (c) are repeated 2 or more times.

14. The method according to claim 1, wherein the method further comprises at least one additional deposition cycle which does not contact the gap with the inhibitor, the at least one additional deposition cycle comprising:
   contacting the gap with the first precursor to chemisorb the first precursor within the gap at chemisorption sites not occupied by the inhibitor; and
   following the contacting the substrate with the first precursor, contacting the gap with the second precursor to form the material within the gap.

15. The method according to claim 14, wherein the at least one additional deposition cycle is done before or after the at least one deposition cycle.

16. The method according to claim 1, wherein the cyclic deposition process is an atomic layer deposition (ALD) process.

17. The method according to claim 1, wherein the gap has an aspect ratio of 10:1 to 1000:1.

18. A method of depositing a material within a gap of a substrate in a cyclic deposition process, the method comprising, within a reaction chamber, subjecting the gap to at least one deposition cycle, the at least one deposition cycle comprising:
   (a) contacting the gap with an inhibitor, wherein the gap comprises a plurality of chemisorption sites on a surface thereof, and wherein the inhibitor occupies a portion of the chemisorption sites in the gap;
   (b) following the contacting the gap with the inhibitor, contacting the gap with a first precursor to chemisorb the first precursor within the gap at chemisorption sites not occupied by the inhibitor; and
   (c) following the contacting the gap with the first precursor, contacting the gap with a second precursor to form the material within the gap,
   wherein the process further comprises removing the inhibitor from the gap, and wherein the removing step is done by the contacting the gap with an oxygen-containing gas.

* * * * *